United States Patent [19]

Levine

[11] 3,997,894
[45] Dec. 14, 1976

[54] ANALOG-TO-DIGITAL CONVERTER WITH ELECTRO-OPTICAL CODING

[75] Inventor: Arnold M. Levine, Chatsworth, Calif.

[73] Assignee: International Telephone and Telegraph Corporation, New York, N.Y.

[22] Filed: June 30, 1975

[21] Appl. No.: 591,287

[52] U.S. Cl. .................... 340/347 AD; 350/96 B
[51] Int. Cl.[2] ............... H03K 13/02; H03K 13/175
[58] Field of Search .......... 340/347 AD; 350/96 B, 350/96 R

[56] References Cited

UNITED STATES PATENTS

| | | | |
|---|---|---|---|
| 2,931,023 | 3/1960 | Quade | 340/347 P |
| 3,518,663 | 6/1970 | Oddo et al. | 340/347 P |
| 3,877,025 | 4/1975 | Maio | 340/347 AD |

FOREIGN PATENTS OR APPLICATIONS 812,604   4/1959   United Kingdom ........... 340/347 P

OTHER PUBLICATIONS

Stigliani, "LIGHT INTERFACE TECHNOLOGY", Conference 1971 IEEE International Electromagnetic —Record, 7/71, p. 316-321.
Callahan, "OPTICAL DELAY LINE COMPRESSOR", IBM Technical Disclosure Bulletin, vol. 14, No. 8, Dec. 1971, pp. 2208, 2209.

Primary Examiner—Thomas J. Sloyan
Attorney, Agent, or Firm—William T. O'Neil

[57] ABSTRACT

An EMP resistant A/D converter having no triggered circuits, the digital code word being formed by sampling the analog function on a periodic basis, selectively quantizing the levels sampled into channels providing the digits of the output code through a discrete fiber optic delay medium for each digit in the output. Electronic to light conversion and vice versa are included.

10 Claims, 5 Drawing Figures

ANALOG-TO-DIGITAL CONVERTER WITH ELECTRO-OPTICAL CODING

BACKGROUND OF THE INVENTION

1. Field of the Invention

The present invention relates to devices for converting analog data in electronic form to digital data in electronic form.

2. Description of the Prior Art

The prior art in respect to analog-to-digital conversion in general, is voluminous. Most of the known devices for the purpose include triggered circuitry such as flip-flops, counters, etc. Such devices are inherently susceptible to electromagnetic pulse interference due to nuclear activity, lightning and other relatively powerful noise impulses. Very often the disruption of operation lasts well beyond the interfering impulse since the upset to the inputs of electronic storage devices and readouts may require many data cycles to effect correction at the very time when the need for accuracy and stability is great.

The manner in which the present invention provides for highly EMP resistant analog-to-digital conversion will be understood as this description proceeds.

SUMMARY OF THE INVENTION

The device according to the present invention contains no triggered or triggering devices and no counting circuits or the like. Instead, strictly passive circuit elements are employed, especially for the generation of a digital code which inherently involves the use of various circuit delays in order that the serial digits comprising such a code may be generated.

The device of the invention involves amplitude sampling of the analog function to be converted, this being accomplished on a predetermined periodic basis. The amplitude samplings are quantized in a plurality of predetermined discrete levels, each level corresponding to a delay channel. A discrete channel for each bit of the digital word is employed. The amplitude quantized samples thus represent point-by-point discrete amplitude values of the analog function to be converted. As in other analog-to-digital converters, the time between samples, and therefore the granularity of the conversion process, can be predetermined in accordance with design criteria.

The delay channels aforementioned are each comprised of an electro-optical transmission medium, preferably a length of fiber optic cable for each bit delay in the digital code, since fiber optic techniques afford an economical, compact and stable delay medium. At the input to each of these fiber optic delay channels, an electronic-to-light transducer, such as a laser device or an LED is provided. Each of these transducer inputs is biased to respond to a particular quantized level of the sample value aforementioned. Thus, the number of these delay channels which is operative and therefore capable of generating a bit at the corresponding delay position within the serial digital word is determined by the quantized value of each of the said samples.

At the fiber optic delay channel outputs, the light signals are reconverted, by photo diodes, typically into electrical signals, to produce a series of digital words describing the variation of the analog function to be converted on a point-by-point basis.

The manner of operation and details of the structure of a typical embodiment based on the concepts of the present invention will be understood from the following description.

It may be said to have been the general objective of the present invention to provide a stable, relatively economical, analog-to-digital converter which is broadly adaptable in electronic systems and which is highly resistant to electromagnetic pulse interference.

DESCRIPTION OF THE PREFERRED EMBODIMENT

Figure 1:
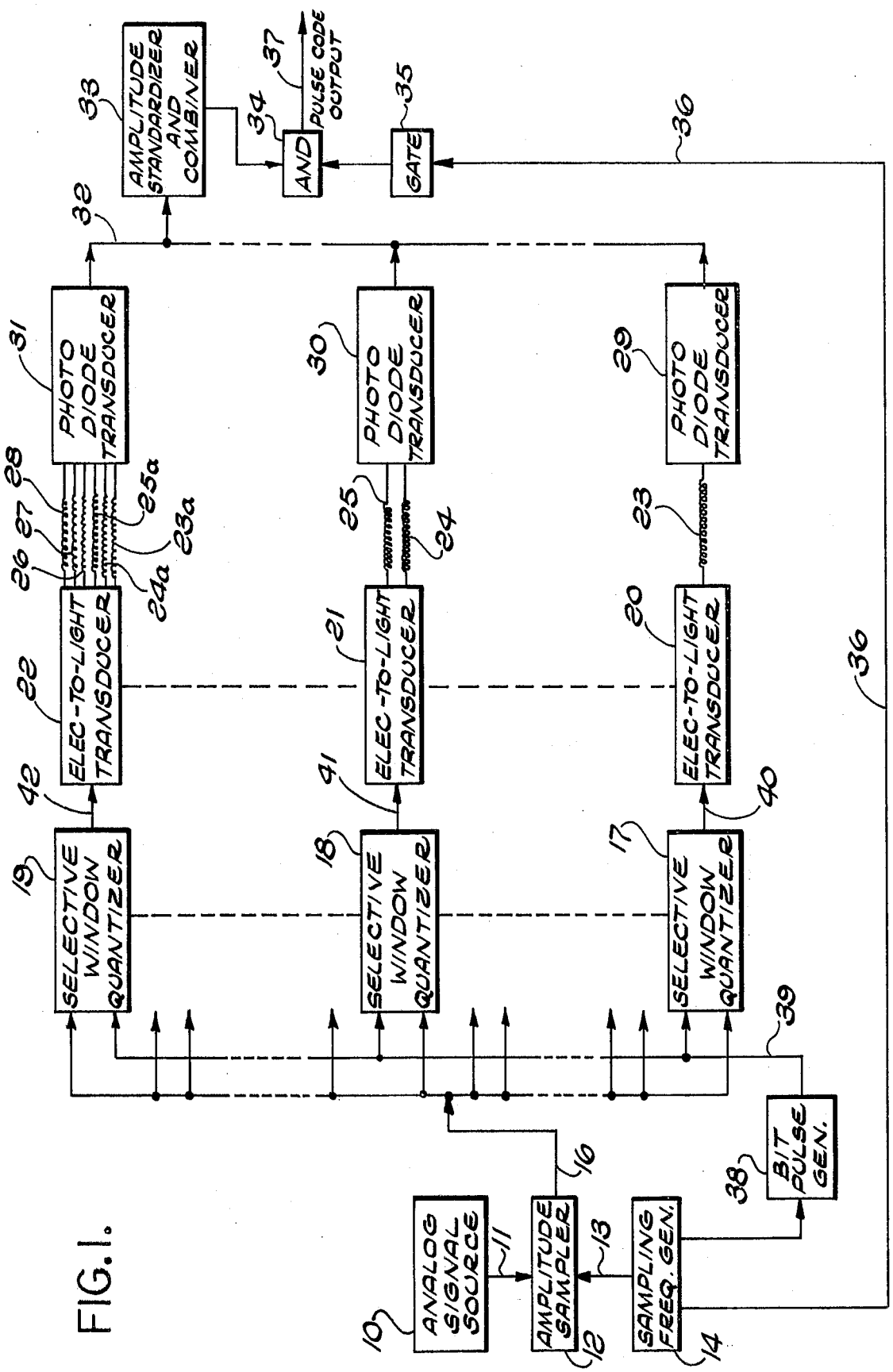
FIG. 1 is a schematic block diagram of an embodiment in accordance with the principles of the present invention.

Referring now to the drawings, the system of FIG. 1 will be described referring occasionally to FIGS. 2 and 3, as appropriate.

The analog signal source 10 shown on FIG. 1 provides an analog signal which it is desired to have converted to digital form. This signal is not necessarily periodic and may be empirical or even random.

Figure 2:
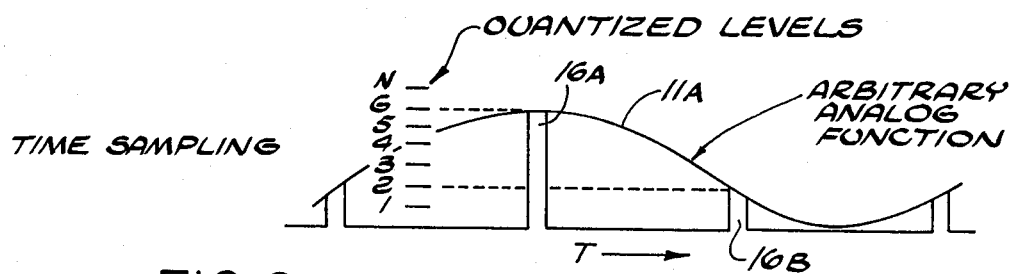
FIG. 2 is a waveform diagram illustrating the time sampling of an arbitrary analog function by the device of FIG. 1.

The output of signal source 10 on lead 11 is represented for illustration as a sinusoidal function displaced above the zero axis at 11a of FIG. 2. It will be realized that the technique of level displacing a periodic function of that type so that its lowest value or negative going peak is tangent to a zero line, can make conversion to digital form more convenient. It is, however, not at all necessary, and once the principles of the present invention are well understood, the practitioner skilled in this art can readily modify the relationship between instantaneous values of the analog function and the corresponding digital word numbers.

Proceeding now with the output signal 11 from the signal source 10, an amplitude sampler 12 is responsive thereto, to sample the said arbitrary analog function at a predetermined rate in accordance with sampling pulses on lead 13 from the sampling frequency generator 14. Such samplings are illustrated in simplified form on FIG. 2, for example, at 16a and 16b. It will be realized that the sampling pulse spacing, viz. between 16a and 16b is much greater as illustrated than would be the case between adjacent sampling pulses in the actual situation. Normally, in a design situation, the rate of change of the arbitary analog function and the acceptable degree of granularity of the digital output would be considered in determining the spacing between adjacent sampling pulses. Obviously also, the width of the sampling pulses, such as 16a and 16b would be small compared to that exaggerated for clarity on FIG. 2. It follows from those considerations, that the digital word produced during each sampling pulse would be generated in a time somewhat less than the said sampling pulse width. Modern digital techniques are developed to the point where a typical six pulse digital word, such as illustrated in FIG. 3a and FIG. 3b could be generated in less than one microsecond if the requirements of any given conversion demanded.

Figure 3A:
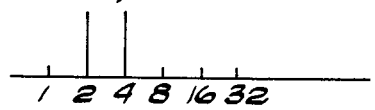
FIGS. 3a and 3b depict level 6 and level 64 serial digital words respectively, as might be produced at the output of the device of FIG. 1.
Figure 3B:

It will be realized that the six pulse word as illustrated in FIGS. 3a and 3b is capable of representing sixty-four discrete levels. The abscissa in FIG. 3a is, of course, in powers of 2, so that FIG. 3a represents level 6 which is also identified in terms of the level of the amplitude of sampling pulse 16a on FIG. 2. In FIG. 3b, the "full count" depicted represents the sixty-fourth quantized level.

The actual mechanism for generating the succession of digital words from the sample values on lead 16 may now be examined.

Proceeding from lead 16, the succession of amplitude samplings, each sample having an amplitude representative of the instantaneous amplitude value of the analog function at the corresponding time, is provided to a bank of selective quantizers, typically 17, 18 and 19. These devices are duplicated, one for each discrete quantized level, in the example given, up to level 64 (in accordance with the six bit digital word arbitrarily selected for this description). Thus, the selective quantizers (of which 17, 18 and 19 are typical of all 64 such units) and each provide a discrete "window" such that an output from each such quantizer is available only when the signal on 16 is within this amplitude window and is neither above nor below it in amplitude.

The circuitry extending from the lead 16 to lead 32 is illustrated only in respect to three corresponding sample amplitudes, namely; the least significant digit of the said six bit digital code (corresponding to components beginning at 17), a level 6 digital word as illustrated in FIG. 3a beginning with circuit 18, and finally a most significant digital word representing level 64 (beginning at circuit 19 et. seq.). Accordingly, it will be understood that there are required, for the six bit digital word, 63 channels beginning with the selective quantizer and outputting to the buss-bar lead 32. The zero condition representing no amplitude at the sample on 16 provides the sixty-fourth sample level.

Let it be assumed that the signal for a given sample on 16 is at level 1. This would require generation of a bit in the least significant position of the digital code to be generated, and that sample amplitude would be accepted only by quantizer 17. The output of 17 then energizes (via lead 40) an elctronic signal-to-light transducer 20 to produce a corresponding light pulse which is delayed by optical delay line 23 only a minimal, but predetermined, amount sufficient to insure its occurrence within the corresponding sample pulse on 16. After passing through the fiber optic delay line 23, the photo-diode transducer 29 reconverts this pulse to the electronic domain and applies it on lead 32.

Of course, had the pulse amplitude at any given sample time on 16 been zero, there would be not output onto 32.

Let it now be assumed that the amplitude of the pulse sample on 16 is at level 6. In that event only the selective window quantizer 18 responds and passes the pulse on output 41 to the transducer 21. In accordance with that condition, it is desired to generate a code as illustrated in FIG. 3a. That condition will be seen to comprise no pulse in the least significant bit position, and pulses only in the next two bit positions as illustrated in FIG. 3a. For this purpose the fiber optic delay lines 24 and 25 are required correspondingly respectively to those positions on FIG. 3a. Since the bit spacing in the present device is determined entirely by the corresponding optical delay media, it will be evident that the delay in 24 is equal to one bit-to-bit interval plus the aforementioned nominal minimal delay afforded by 23. The delay line 25 provides that delay plus one more bit-to-bit interval. At this point it should be noted that only a single laser, LED, or other elctronic-to-light pulsed transducer is required to provide this function in each "channel", all of the optical delay lines connected thereto in the corresponding channel being energized therefrom in parallel. The photo-diode transducer 30 will obviously now decode these delayed light pulses to produce the configuration of FIG. 3a on 32.

For one further example, let it be assumed that the pulse amplitude on 16 is a full level, i.e., level sixty-four. For this level it is required that the digital word configuration of FIG. 3b is generated. Accordingly, quantizer 19 responds exclusively, providing an output on 42 of the same nature as that provided previously on 40 and 41, and transducer 22 responds, generating a single light pulse substantially contemporaneous with the least significant bit of the code of FIG. 3b. The fiber optic delay media 23a, 24a, 25a, 26, 27 and 28 are then enerigzed from the resulting light pulse in parallel and the photo-diode 31 provides an output as depicted in FIG. 3b. It will be realized that fiber optic delay line 23a provides the same delay as does 23. Moreover, delay lines 24a and 25a provide the same amount of delay as 24 and 25, respectively.

Intervening between the three channels illustrated, there are of course, many more for the production of the intervening code configurations. From the description already given, it will be obvious to those skilled in this art how these additional channels function, and from the individual code configuration corresponding to each the optical delay line configuration required is evident.

In view of the different optical delay line lengths, and because of variations in the intensity provided by the electronic-to-light transducers and other factors, it will be realized that not all of the code pulses provided at output 32 will be of the same amplitude. Accordingly, as these are combined in 33, they are readily also amplified and limited so that the output of 33, as provided to AND circuit 34, comprise code pulses of uniform amplitude. In order that the output 37 should contain digital words discretely representative of the individual analog function levels and so that extraneous pulses extant between digital words are not permitted to output at 37, a gate 35 pulses the AND circuit 34 contemporaneously with the sampling pulses from generator 14. To effect this synchronous gating feature, the lead 36 controls the gate 35 at the sampling frequency provided by generator 14.

Returning now to the selective window quantizers, typically 17, 18 and 19, these will be further explained in relation to the bit pulse generator 38.

At this point in the discussion it will be evident that the bit pulse generator 38 is required in order to provide basic code pulses or bits of the desired standard duration. For this purpose device 38 operates to provide an elctronic pulse in the first bit position within each of the sampling pulses from 14. Each of the selective window quantizers receives this bit pulse in addition to the signal on 16, so that the window passes a pulse at a predetermined time in each channel.

Figure 4:
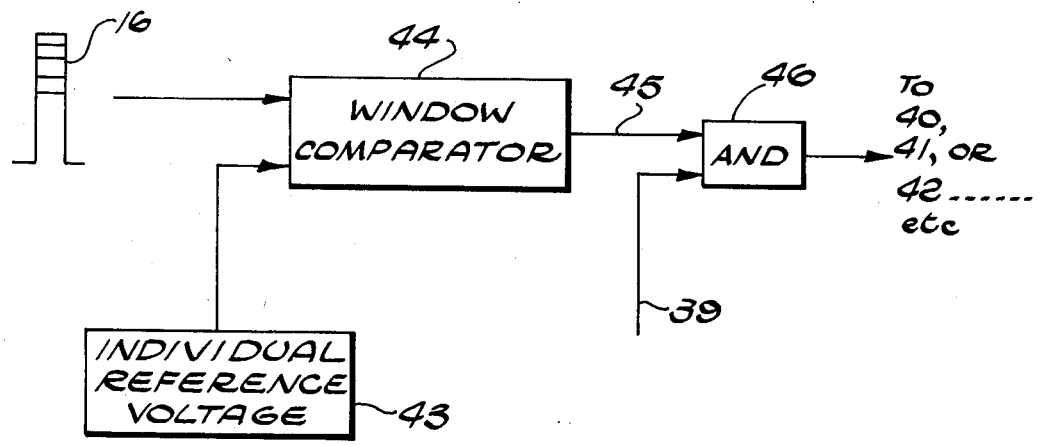
FIG. 4 shows the structure of the selective window quantizers of FIG. 1.

Referring now to FIG. 4 the structure of the selective window quantizers will be discussed.

Since, as previously indicated, it is desired that each of these quantizers respond only to a discrete pulse level on 16 and not to pulses below or above the level, and since each of the quantizers responds to a different level of the pulses on 16, a circuit for the quantizers is required which provides this function and which allows pre-selection of the threshold or window of response in each channel. In FIG. 4 one very acceptable device for instrumenting the selective window quantizers is illustrated. A window comparator 44, which is a circuit for comparing the amplitude extant on 16 with a fixed individual reference voltage 43 (different in each quantizer position in FIG. 1 of course) resulting in a gate pulse the same width as sampling pulse on 16, on the output 45 when the amplitude of the said pulse, on 16 is within the amplitude window defined by the reference voltage supplied by 43, plus or minus a predetermined tolerance. Accordingly, AND circuit 46 may then permit one of the bit pulses generated by 38 and applied to lead 39 to be passed to the electronic-to-light transducers via leads 40, 41 or 42, etc. This pulse at the output of the light transducers via leads 40, 41 or 42, etc. This pulse at the output of the AND circuit 46 occurs once during each sampling pulse on 16.

Window comparators such as illustrated in 44 are known in the art generally. It is noted that a circuit suitable for this function is described in the textbook "Electronic Analog and Hybrid Computers", by Korn and Korn (Second Edition McGraw-Hill 1972). In particular, the devices of FIGS. 4–18 in the discussion of comparators in Section 4–9, are pertinent.

At the current state of the art, devices herein referred to as selective window quantizers, and the other electronic circuits involved, can be implemented using integrated circuits and other solid state techniques, such that the effect of the relatively large number of parallel signal channels between lead 16 and lead 32 is not significantly disadvantageous in terms of size and cost. Similarly, the electronic-to-light transducers and the photo-diode transducers are very small devices.

Since there is no requirement for large light intensity accommodation within the fiber optic delay lines, precut lengths of very small fiber optic cable, which is readily commercially available, can be used. These fused silica light conducting cables may have one or more very small diameter strands of fused silica material and commonly provide about 50% more delay per unit length than occurs in air. Moreover, since the inter-digital spacing in the digital word is usually on the order of nanoseconds in practical modern digital systems, the required delay in terms of fiber optic cable links is not substantial, and since they may have "thread like" fibers they may be spooled or coiled to provide small packaging notwithstanding the substantial number of individual cables used.

Numerous variations and modifications in the actual implementation of the invention will suggest themselves to those skilled in these arts, once the principles of the present invention are well understood. Accordingly, it is not intended that the scope of the invention should be limited to the embodiment illustrated and described. The drawings and this description are considered illustrative only.

What is claimed is:

1. A device for converting an analog function in electrical form to a series of digital words representative of the amplitude of said analog function at corresponding successive points thereof spaced in time by a predetermined amount, comprising:

first means for sampling said analog function at said successive points to provide a corresponding succession of amplitude values;

second means comprising a plurality of window circuits each responsive to said succession of amplitude values, said window circuits each being adapted to provide an output signal only when a corresponding sample value occurs within said succession of amplitude values at the output of said first means;

third means comprising a plurality of electronic signal-to-light transducers, one of said plurality of transducers being exclusively responsive to each of said window circuits to produce a light pulse substantially at the time of occurrence of an output signal from the corresponding window circuit;

fourth means comprising a discrete optical delay arrangement responsive to each of said electronic signal-to-light tranducers, said delay arrangement corresponding to each of said electronic signal-to-light transducers including a number of at least one optical delay lines of varying lengths responsive in parallel to said light pulse generated by the corresponding transducer within said third means, to generate a denominational digital word in light pulse form serially in time representative of the amplitude value significance of the corresponding window circuit of said second means;

and fifth means responsive to the output of said optical delay lines of said fourth means to provide a succession of digital words representative of said succession of amplitude values of said analog function.

2. A device according to claim 1 in which said optical delay lines of each of said optical delay arrangement each provide a delay equal to that required to produce the corresponding serial code word bit within the corresponding one of said digital words.

3. A device according to claim 2 in which each of said optical delay lines comprises a fiber optic cable having a predetermined length producing said delay required to produce said corresponding code bit.

4. Apparatus according to claim 3 in which said electronic signal-to-light transducers each comprise a laser light pulse generator responsive to said output signal from said third means.

5. Apparatus according to claim 4 in which said electronic signal-to-light transducers each comprise a LED responsive to said output signal from said third means.

6. Apparatus according to claim 3 in which said fifth means comprises light-to-electronic signal conversion means for providing electrical digital words in response to a corresponding pattern of said light pulses from said optical delay lines.

7. Apparatus according to claim 6 in which said light-to-electronic signal conversion means includes at least one photo diodes responsive to said fiber optic cables.

8. Apparatus according to claim 6 including means responsive to said light-to-electronic signal conversion means for standardizing amplitudes within said digital words.

9. Apparatus according to claim 6 including a sampling frequency generator for controlling said first means to sample at predetermined intervals, said apparatus also including a bit pulse generator synchronized from said sampling frequency generator for generating digital bits having a predetermined duration, said digital bits being provided to said second means as a second input thereto, said second means passing one of said pulses each time said first means output supplied as a first input to said second means reaches a value corresponding to the window of a corresponding one of said window circuits.

10. Apparatus according to claim 9 further including gating means controlled from said sampling frequency generator, said gating means being operative to permit the output of said standardizer to be passed externally only during the time durations of said sampling.

* * * * *